United States Patent
Feng et al.

(10) Patent No.: US 12,439,583 B2
(45) Date of Patent: Oct. 7, 2025

(54) SEMICONDUCTOR STRUCTURE MANUFACTURING METHOD AND SEMICONDUCTOR STRUCTURE

(71) Applicant: Changxin Memory Technologies, Inc., Anhui (CN)

(72) Inventors: Daohuan Feng, Hefei (CN); Xiaojie Li, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 434 days.

(21) Appl. No.: 18/093,969

(22) Filed: Jan. 6, 2023

(65) Prior Publication Data
US 2023/0403841 A1 Dec. 14, 2023

Related U.S. Application Data

(63) Continuation of application No. PCT/CN2022/108097, filed on Jul. 27, 2022.

(30) Foreign Application Priority Data

Jun. 13, 2022 (CN) .......................... 202210663531.3

(51) Int. Cl.
  *H10B 12/00* (2023.01)
(52) U.S. Cl.
  CPC .................................. *H10B 12/056* (2023.02)
(58) Field of Classification Search
  CPC ... H10B 12/056; H10B 12/482; H10B 12/488
  See application file for complete search history.

(56) References Cited

U.S. PATENT DOCUMENTS

| 8,614,127 B1* | 12/2013 | Yang ............... H10D 64/017 |
| | | 257/E21.429 |
| 2013/0119477 A1 | 5/2013 | Fumitake |
| 2014/0256136 A1 | 9/2014 | Tsai et al. |
| 2016/0365286 A1 | 12/2016 | Basker et al. |
| 2021/0242213 A1* | 8/2021 | Jiang ................. H10B 12/34 |
| 2021/0408261 A1* | 12/2021 | Zhang ............... H10D 30/63 |

FOREIGN PATENT DOCUMENTS

| CN | 103107192 A | 5/2013 |
| CN | 213340383 U | 6/2021 |
| KR | 2006-0127542 A | 12/2006 |

OTHER PUBLICATIONS

PCT International Search Report and the Written Opinion mailed Dec. 20, 2022, issued in related International Application No. PCT/CN2022/108097 (16 pages).
Jacopo Franco et al., SiGe Channel Technology: Superior Reliability Toward Ultrathin EOT Devices—Part I: NBTI, IEEE Transactions on Electron Devices, 2012.
Amaury Gendron-Hansen et al., "TCAD Analysis of FinFET Stress Engineering for CMOS Technology Scaling", SISPAD 2015, Sep. 9-11, 2015, Washington, DC, pp. 417-420.

* cited by examiner

*Primary Examiner* — Mohammad A Rahman
(74) *Attorney, Agent, or Firm* — Sheppard Mullin Richter & Hampton LLP

(57) ABSTRACT

A semiconductor structure manufacturing method includes: providing a substrate and forming a groove in the substrate; forming a barrier layer on a sidewall of the groove; epitaxially growing a channel material from a bottom of the groove to form an intermediate structure in the groove; and removing a portion of the intermediate structure and a portion of the substrate to form a fin structure.

17 Claims, 10 Drawing Sheets

SEMICONDUCTOR STRUCTURE MANUFACTURING METHOD AND SEMICONDUCTOR STRUCTURE

CROSS REFERENCE TO RELATED APPLICATIONS

The present application is a continuation application of International Patent Application No. PCT/CN2022/108097, filed on Jul. 27, 2022, which claims priority to Chinese Patent Application No. 202210663531.3, filed with the China National Intellectual Property Administration on Jun. 13, 2022 and entitled "SEMICONDUCTOR STRUCTURE MANUFACTURING METHOD AND SEMICONDUCTOR STRUCTURE." The above-referenced applications are incorporated herein by reference in their entirety.

TECHNICAL FIELD

The present disclosure relates to the field of semiconductor technologies, and in particular, to a semiconductor structure manufacturing method and a semiconductor structure.

BACKGROUND

The methods of manufacturing a semiconductor structure often include making a fin field-effect transistor (FinFET). The fin field-effect transistor includes a fin structure and a gate structure disposed on a substrate. The gate structure encloses and surrounds the fin structure, and a channel region is formed in the area of the fin structure covered by the gate structure. A source region and a drain region are located on two sides of the channel region.

However, in the prior art, the performance of the transistor is often poor, and there is a need to further improve the transistor performance.

SUMMARY

According to a first aspect, an embodiment of the present disclosure provides a semiconductor structure manufacturing method, including: providing a substrate and forming a groove in the substrate; forming a barrier layer on a sidewall of the groove; epitaxially growing a channel material from a bottom of the groove to form an intermediate structure in the groove; and removing a portion of the intermediate structure and a portion of the substrate to form a fin structure.

According to a second aspect, the present disclosure further provides a semiconductor structure formed based on the above semiconductor structure manufacturing method, including a substrate and fin structures spaced above the substrate.

DESCRIPTION OF EMBODIMENTS

Figure 1:
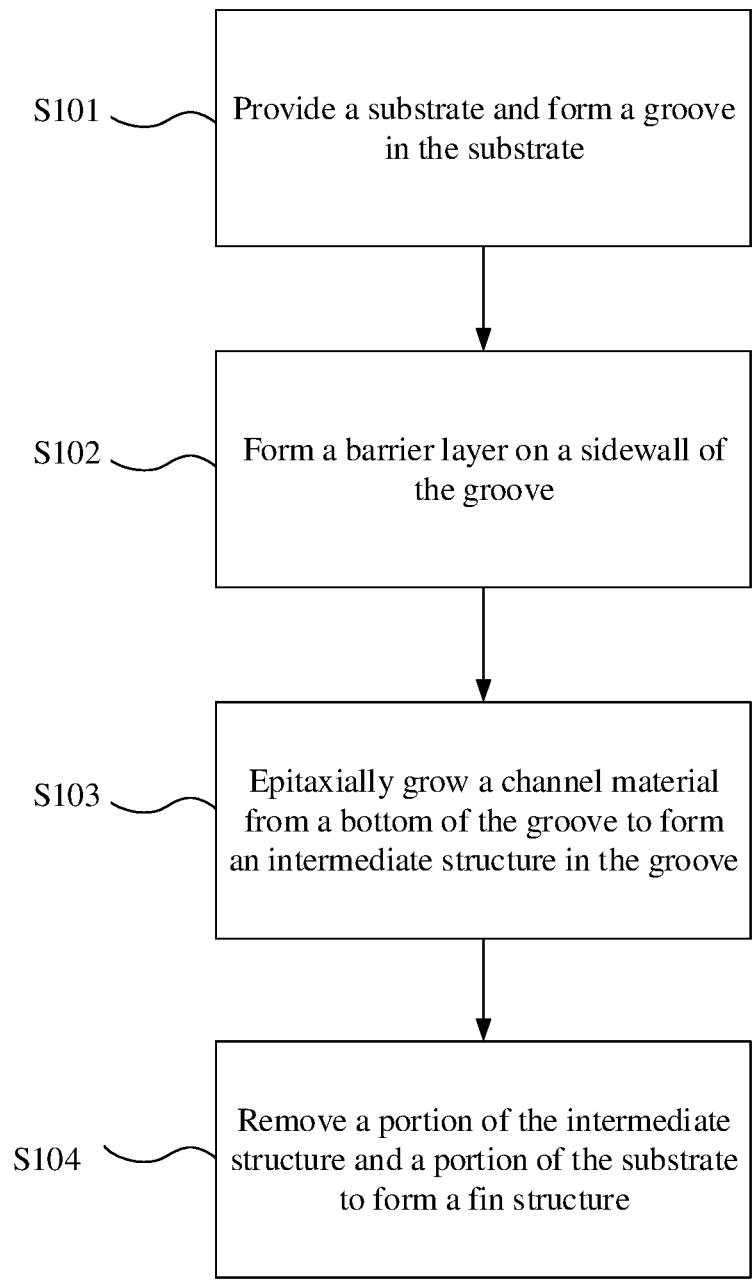
FIG. 1 is a flowchart illustrating a semiconductor structure manufacturing method according to an embodiment of the present disclosure.

In the prior art, the manufacturing processes of a fin structure in a semiconductor structure are generally divided into two types: gate-first process and gate-last process. The gate-first process has advantages such as relatively simple manufacturing steps, relatively low manufacturing costs, and good thermal resistance of the semiconductor structure. Therefore, the gate-first process is widely used in manufacturing the fin structure in a dynamic random access memory (DRAM).

The steps of manufacturing a fin structure by using the gate-first process generally includes: forming a groove on a substrate, growing silicon germanium on the two sidewalls and a bottom surface of the groove, and subsequently removing a portion of the substrate and a portion of the silicon germanium to form a fin structure. However, it has been discovered that the lattice structure of the silicon germanium formed on the above-mentioned three surfaces is relatively chaotic, thereby causing poor performance of the transistor thus formed.

In view of this, embodiments of the present disclosure provide a semiconductor structure manufacturing method and a semiconductor structure. The semiconductor structure manufacturing method includes: providing a substrate and forming a groove in the substrate; forming a barrier layer on a sidewall of the groove; epitaxially growing a channel material from a bottom of the groove to form an intermediate structure in the groove; and removing a portion of the intermediate structure and a portion of the substrate to form a fin structure. Compared with growth of silicon germanium on two sidewalls and a bottom surface of a groove in prior art, in the embodiments of the present disclosure, a channel material is grown solely on/from the bottom of the groove, and internal lattices of a fin structure formed are stably arranged, which improves performance of a transistor.

To clearly illustrate the objectives, technical solutions, and advantages of the present disclosure, the following describes the technical solutions in the embodiments of the present disclosure in more detail with reference to the accompanying drawings in the embodiments of the present disclosure. In the accompanying drawings, the same or similar reference numerals represent the same or similar parts or parts having the same or similar functions. The described embodiments are part rather than all of the embodiments of the present disclosure. The embodiments described below with reference to the accompanying drawings are examples and are intended to explain the present disclosure without limiting the present disclosure. Based on the present disclosure, a person skilled in the art can obtain other embodiments without creative efforts, which shall fall within the scope of the present disclosure. The following describes the embodiments of the present disclosure in detail with reference to the accompanying drawings.

It should be noted that the semiconductor structure provided in the embodiments of the present disclosure can be incorporated into a PMOS field-effect transistor, or electronic devices such as chips formed by the PMOS field-effect transistor and a NMOS field-effect transistor. Referring to FIG. 1, a semiconductor structure manufacturing method according to an embodiment of the present disclosure includes the following steps:

S101. Provide a substrate and form a groove in the substrate.

Figure 2:
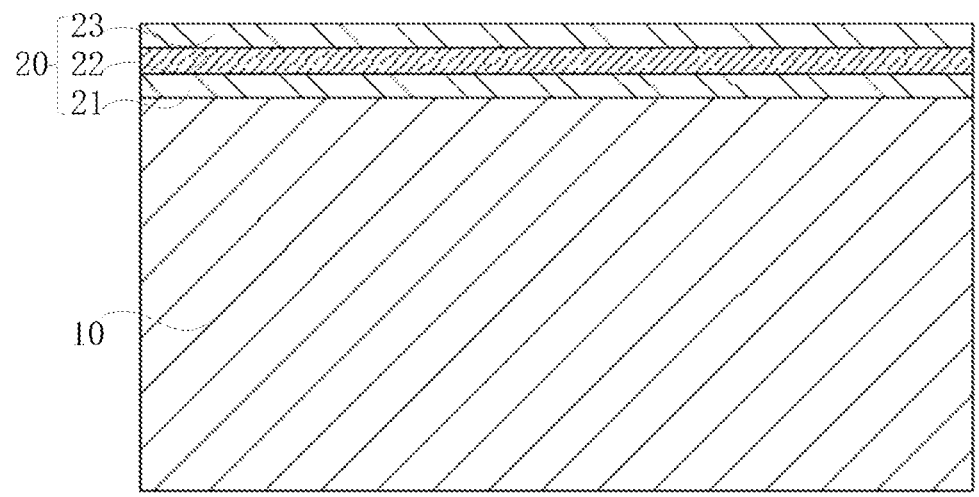
FIG. 2 is a schematic structural diagram illustrating a substrate provided in a semiconductor structure manufacturing method according to an embodiment of the present disclosure.

Referring to FIG. 2, a semiconductor structure includes a substrate 10. The substrate 10 can provide a structural base for subsequent structures and processes. A material of the substrate 10 can include any one or more of silicon, germanium, silicon germanium, and silicon carbide, a silicon substrate 10 on an insulator, or a germanium substrate 10 on an insulator. In this embodiment, the material of the substrate 10 can be silicon.

Figure 3:
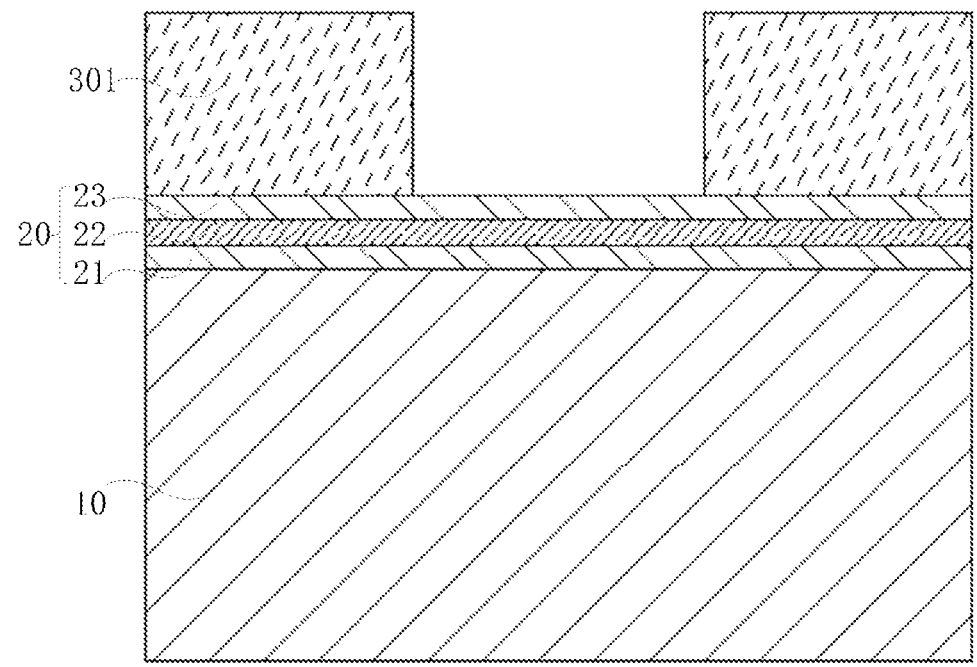
FIG. 3 is a schematic structural diagram illustrating forming a first opening in a semiconductor structure manufacturing method according to an embodiment of the present disclosure.
Figure 4:
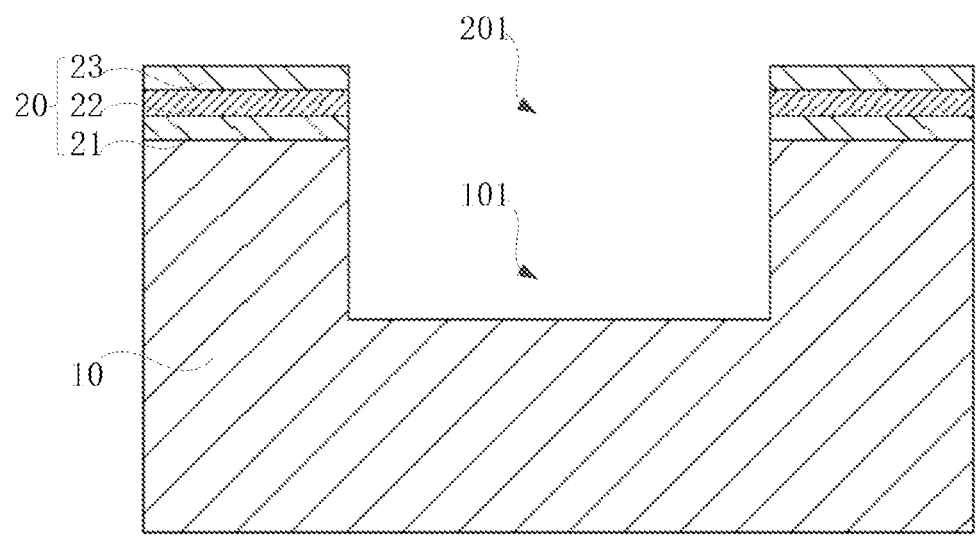
FIG. 4 is a schematic structural diagram illustrating forming a groove in a semiconductor structure manufacturing method according to an embodiment of the present disclosure.

Referring to FIG. 3 and FIG. 4, the step of forming the groove 101 in the substrate includes: forming a first sacrificial layer 20 on the substrate 10, and etching the first sacrificial layer 20 to form a first opening 201.

The first sacrificial layer 20 includes a third insulating layer 21, a fourth insulating layer 22, and a fifth insulating layer 23, the third insulating layer 21 covers a surface of the substrate 10, the fourth insulating layer 22 is located between the third insulating layer 21 and the fifth insulating layer 23, and the fifth insulating layer 23 covers a surface of the fourth insulating layer 22 that is away from the substrate 10. In an embodiment, a material of the first sacrificial layer 20 can include one or more of silicon nitride, silicon oxide, and silicon oxynitride. For example, materials of the third insulating layer 21 and the fifth insulating layer 23 can be silicon oxide, and a material of the fourth insulating layer 22 can be silicon nitride. Silicon nitride and silicon oxide are sequentially stacked, which helps improve insulation effects of the first sacrificial layer 20.

Certainly, in some other embodiments, the first sacrificial layer 20 can further include another insulation structure, which is not specifically limited in this embodiment of the present disclosure.

Referring to FIG. 3, the step of etching the first sacrificial layer 20 to form the first opening 201 includes: forming a first photoresist layer 301 on the first sacrificial layer 20. The first photoresist layer 301 has a first photoresist pattern; and etching the first sacrificial layer 20 by using the first photoresist layer 301 as a mask, to form the first opening 201 in the first sacrificial layer 20.

Referring to FIG. 4, after the first sacrificial layer 20 is formed, the step of forming the groove 101 in the substrate 10 further includes: etching a portion of the substrate 10 along the first opening 201 to form the groove 101. In an embodiment, the first sacrificial layer 20 can be used as a mask to remove a portion of the substrate 10 by using a wet etching or dry etching process, and the formed groove 101 provides a structural basis for subsequent structures and processes.

In this embodiment, after the groove 101 is formed in the substrate 10, the method further includes:

S102. Form a barrier layer on a sidewall of the groove.

Figure 5:
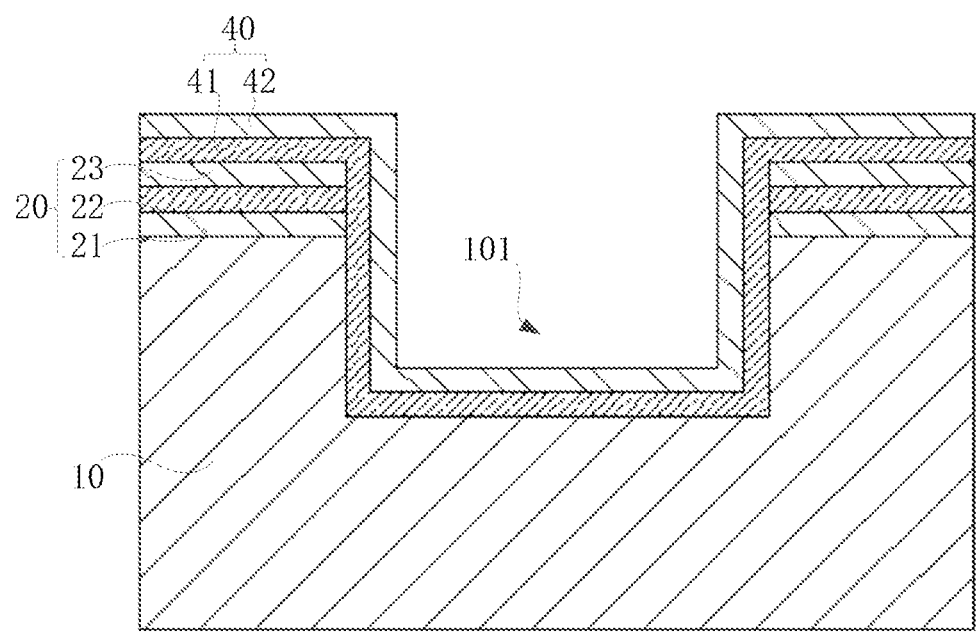
FIG. 5 is a schematic structural diagram illustrating forming a second sacrificial layer in a semiconductor structure manufacturing method according to an embodiment of the present disclosure.
Figure 6:
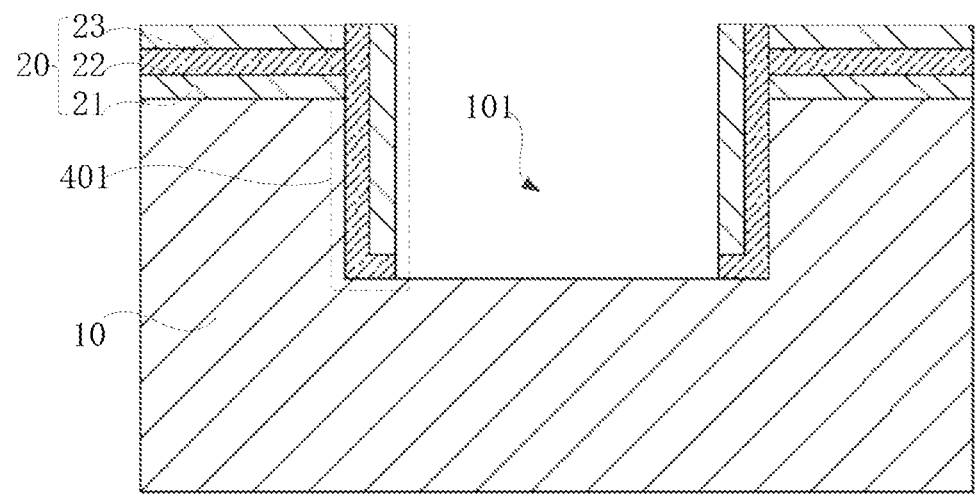
FIG. 6 is a schematic structural diagram illustrating forming a barrier layer in a semiconductor structure manufacturing method according to an embodiment of the present disclosure.

Referring to FIGS. 5 and 6, the step of forming the barrier layer 401 (FIG. 6) on the sidewall of the groove 101 includes: forming a second sacrificial layer 40 on the sidewall and at the bottom of the groove 101.

In this embodiment, the forming the second sacrificial layer 40 on the sidewall and at the bottom of the groove 101 includes: forming a first insulating layer 41 on the sidewall and at the bottom of the groove 101; and forming a second insulating layer 42 on the first insulating layer 41, the first insulating layer 41 and the second insulating layer 42 constituting the second sacrificial layer 40. In an embodiment, a material of the second sacrificial layer 40 can include one or more of silicon nitride, silicon oxide, and silicon oxynitride. For example, the material of the first insulating layer 41 can be silicon nitride, and the material of the second insulating layer 42 can be silicon oxide. Silicon nitride and silicon oxide are stacked, which helps improve insulation effects of the second sacrificial layer 40.

Certainly, in some other embodiments, the second sacrificial layer 40 can further include another insulation structures and materials, which is not specifically limited in this embodiment of the present disclosure.

Referring to FIG. 6, after the second sacrificial layer 40 is formed on the sidewall and at the bottom of the groove 101, the step of forming the barrier layer 401 on the sidewall of the groove 101 further includes: removing the second sacrificial layer 40 at the bottom of the groove 101. The second sacrificial layer 40 on the sidewall of the groove 101 forms the barrier layer 401.

For example, while the second sacrificial layer 40 at the bottom of the groove 101 is removed, the second sacrificial layer 40 on the sidewall of the groove 101 is preserved, and the second sacrificial layer 40 on the sidewall of the groove 101 is the barrier layer 401. By disposing the barrier layer 401, it is helpful to avoid exposure of the sidewall of the groove 101, and further to prevent a structure formed in the groove 101 from coming into contact with the sidewall of the groove 101.

In this embodiment, the step of removing the second sacrificial layer 40 at the bottom of the groove 101 includes: removing the second insulating layer 42 at the bottom of the groove 101 by using anisotropic dry etching. By using an anisotropic dry etching process, etching-back is prevented in an etching process, so the second insulating layer 42 covering the sidewall is prevented from being etched out. After the second insulating layer 42 is removed, the substrate 10 can be cleaned by using a cleaning liquid, so as to remove the first insulating layer 41 at the bottom of the groove 101. The first insulating layer 41 is removed by using the cleaning liquid, so damage to a surface of the substrate 10 can be avoided in the etching process, subsequent growth of the channel material at the bottom of the groove 101 can be prevented, and performance of a formed transistor can be further improved.

In an embodiment, the cleaning liquid can be, for example, phosphoric acid, which ensures removal of the first insulating layer 41, reducing impact on the surface of the substrate 10 in a removal process, and further improving performance of the transistor.

Certainly, in some other embodiments, the step of removing the second sacrificial layer 40 at the bottom of the groove 101 further includes: directly removing the first insulating layer 41 and the second insulating layer 42 by using dry etching, which facilitates simplifying a manufacturing step of the semiconductor structure and improves manufacturing efficiency of the semiconductor structure.

Still referring to FIG. 6, it should be noted that the first sacrificial layer 20 further covers the substrate 10 outside of the groove 101, and the second sacrificial layer 40 further covers the first sacrificial layer 20 on the substrate 10 while forming the second sacrificial layer 40 on the sidewall and at the bottom of the groove 101. In this embodiment, when the second sacrificial layer 40 at the bottom of the groove 101 is removed, the method further includes: removing the second sacrificial layer 40 on the substrate 10 outside of the groove 101, which facilitates simplifying the manufacturing step of the semiconductor structure, and improves the manufacturing efficiency of the semiconductor structure. Further, after the second sacrificial layer 40 on the substrate 10 is removed, a top surface of the first sacrificial layer 20 is flush with a top surface of the preserved second sacrificial layer 40, thereby improving regularity of the semiconductor structure.

In this embodiment, after the barrier layer 401 is formed on the sidewall of the groove 101, the method further includes:

S103. Epitaxially grow a channel material from a bottom of the groove to form an intermediate structure in the groove.

Figure 7:
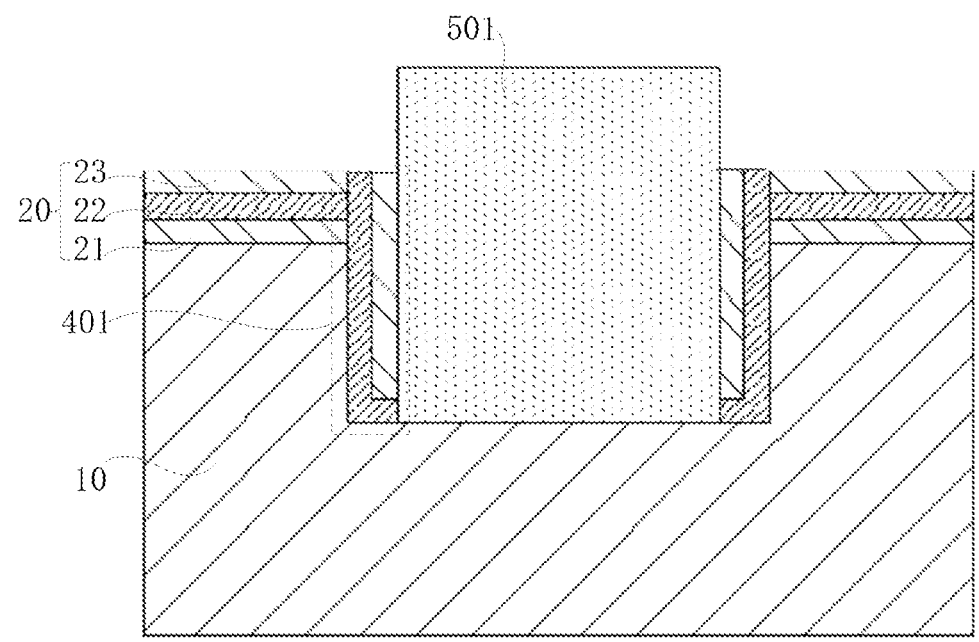
FIG. 7 is a schematic structural diagram illustrating filling a channel material in a semiconductor structure manufacturing method according to an embodiment of the present disclosure.

Referring to FIG. 7, because the sidewall of the groove 101 is covered with the barrier layer 401, the channel material 501 can be epitaxially grown only in a direction from the bottom of the groove 101 up, so lattice arrangements inside the channel material 501 are stable, thereby improving stability of the formed intermediate structure 50 (FIG. 8), and improving performance of the formed transistor.

In this embodiment, the channel material 501 can be silicon germanium. Because the channel material 501 includes a germanium element, hole mobility of the formed intermediate structure 50 can be improved, so as to reduce a resistance of the intermediate structure 50, thereby further improving the performance of the formed transistor. Further, because lattice constants formed by the germanium element and the silicon element are different, when lattices of the germanium element and the silicon element are grown and formed in the groove 101, internal stress of the formed intermediate structure 50 is reduced, and electrical performance of the intermediate structure 50 is further improved. Further, the channel material 501 is silicon germanium, which improves heat resistance performance of the semiconductor structure.

Referring to FIG. 7, the step of forming the intermediate structure 50 further includes: growing the channel material 501 to protrude from the groove 101. When the channel material 501 is filled in the groove 101, the channel material 501 protrudes from the groove 101, so as to avoid a gap in the groove 101.

Figure 8:
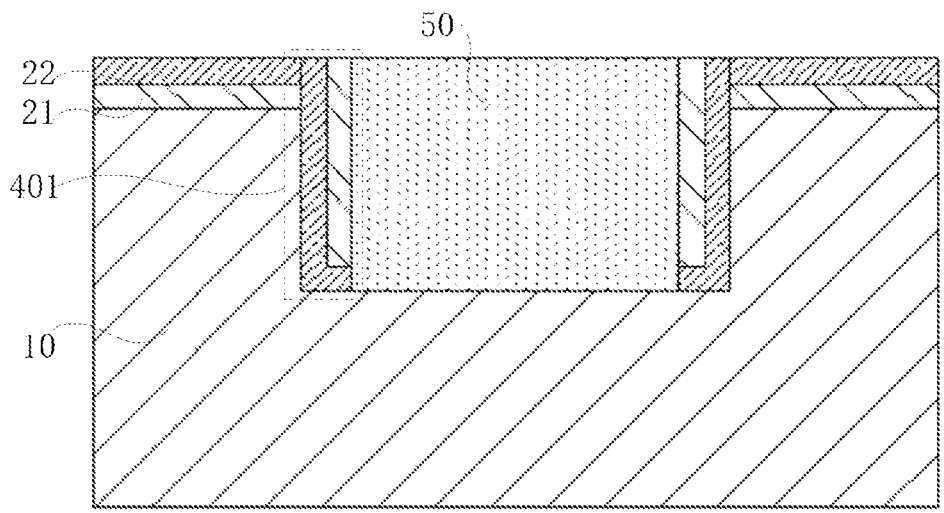
FIG. 8 is a schematic structural diagram illustrating removing a portion of a channel material by using a chemical mechanical polishing process in a semiconductor structure manufacturing method according to an embodiment of the present disclosure.

Referring to FIG. 8, after the channel material 501 is formed, the step of forming the intermediate structure 50 further includes: removing a portion of the channel material 501 and the fifth insulating layer 23 on the substrate 10 by using a chemical mechanical polishing process, to form the intermediate structure 50, a top surface of the intermediate structure 50 being flush with a surface of the fourth insulating layer 22. For example, when chemical mechanical polishing is performed, a top end of the intermediate structure 50 and the fifth insulating layer 23 on the substrate 10 are simultaneously polished.

In this embodiment, because materials of the fifth insulating layer 23 and the fourth insulating layer 22 in the first sacrificial layer 20 are different, it is helpful for a chemical mechanical polishing device to stop grinding when identifying and grinding to the fourth insulating layer 22, thereby ensuring polishing accuracy. Further, by using the chemical mechanical polishing process, flatness of the top surface of the formed intermediate structure 50 is ensured, and performance of a subsequently formed transistor is improved.

In this embodiment, after the intermediate structure 50 is formed, the method further includes:

S104. Remove a portion of the intermediate structure and a portion of the substrate to form a fin structure.

Referring to FIG. 9 to FIG. 16, the step of removing the portion of the intermediate structure 50 and the portion of the substrate 10 includes: forming a third sacrificial layer 60 on the intermediate structure 50, and patterning the third sacrificial layer 60.

Figure 9:
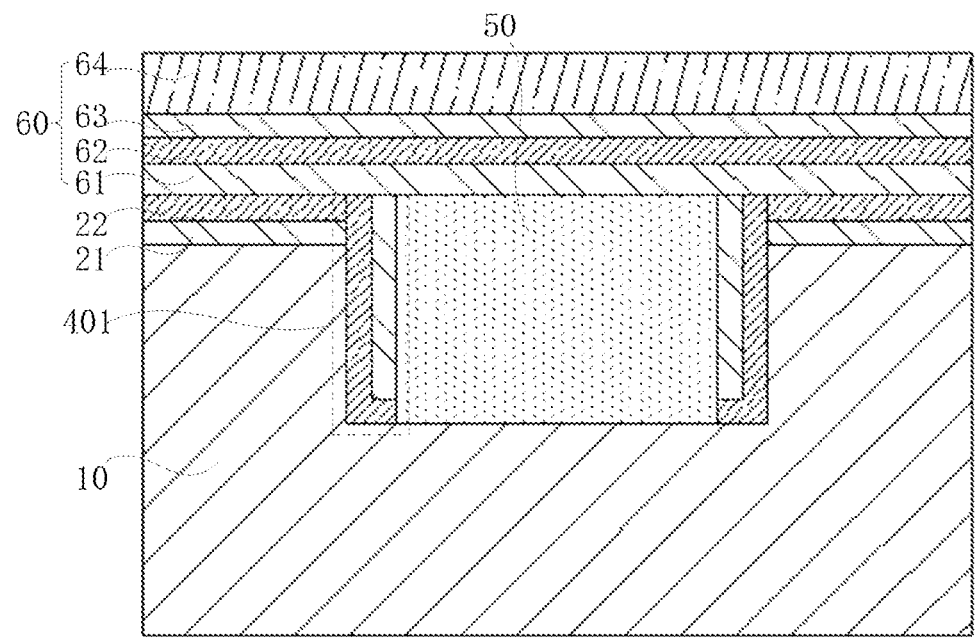
FIG. 9 is a schematic structural diagram illustrating forming a third sacrificial layer in a semiconductor structure manufacturing method according to an embodiment of the present disclosure.

For example, referring to FIG. 9, the third sacrificial layer 60 includes a sixth insulating layer 61, a seventh insulating layer 62, and an eighth insulating layer 63. The sixth insulating layer 61 covers the intermediate structure 50 and a top surface of the fourth insulating layer 22, the seventh insulating layer 62 is located between the sixth insulating layer 61 and the eighth insulating layer 63, and the eighth insulating layer 63 covers a surface of the seventh insulating layer 62 that is away from the substrate 10. In an embodiment, a material of the third sacrificial layer 60 can include one or more of silicon nitride, silicon oxide, and silicon oxynitride. For example, materials of the sixth insulating layer 61 and the eighth insulating layer 63 can be silicon oxide, and a material of the seventh insulating layer 62 can be silicon nitride. Silicon nitride and silicon oxide are sequentially stacked, which helps improve insulation effects of the third sacrificial layer 60.

Certainly, in some other embodiments, the third sacrificial layer 60 can further include another insulation structure, which is not specifically limited in this embodiment of the present disclosure.

Referring to FIG. 9, in this embodiment, the third sacrificial layer 60 can further include a hard mask layer 64. The hard mask layer 64 is located on a surface of the eighth insulating layer 63 that is away from the substrate 10, and a material of the hard mask layer 64 can be, for example, poly silicon.

In this embodiment, after the third sacrificial layer 60 is formed, the step of patterning the third sacrificial layer 60 includes: forming a mask block 801 on the third sacrificial layer 60, an orthographic projection of the mask block 801 on the substrate 10 being located in the intermediate structure 50.

Figure 10:
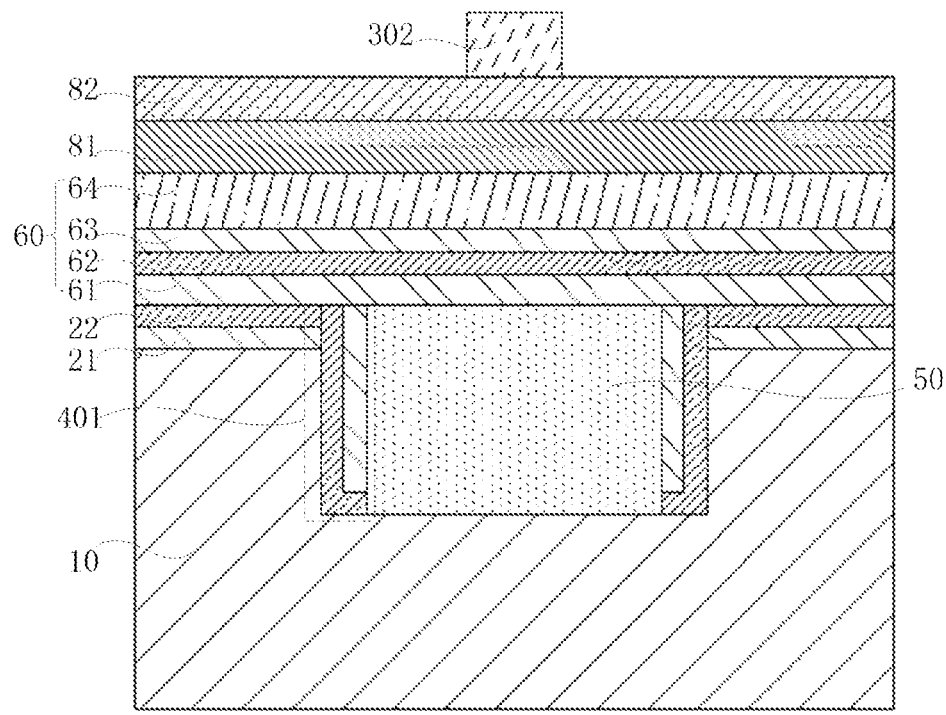
FIG. 10 is a schematic structural diagram illustrating forming a second photoresist layer in a semiconductor structure manufacturing method according to an embodiment of the present disclosure.
Figure 11:
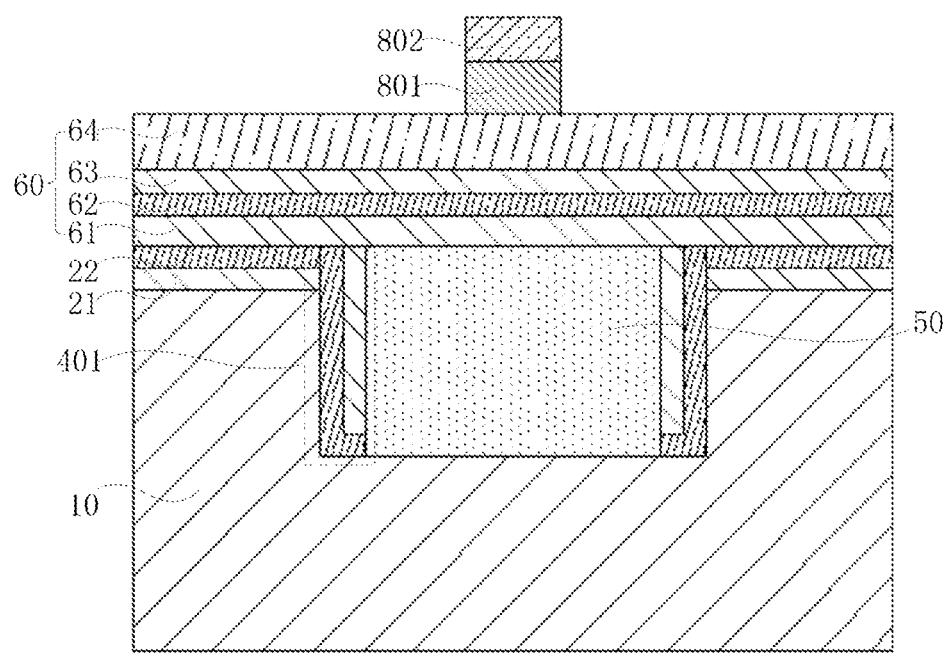
FIG. 11 is a schematic structural diagram illustrating forming a mask block in a semiconductor structure manufacturing method according to an embodiment of the present disclosure.

Referring to FIG. 10 and FIG. 11, the step of forming the mask block 801 on the third sacrificial layer 60 includes: forming a mask layer 81 on the third mask layer 81, and forming an anti-reflection layer 82 on a surface of the mask layer 81 that is away from the substrate 10. In an embodiment, a material of the mask layer 81 can include one of silicon nitride or silicon oxynitride. A material of the anti-reflection layer 82 can be, for example, organosiloxane or spin-on-carbon (SOC). A second photoresist layer 302 is formed on a surface of the anti-reflection layer 82 that is away from the substrate 10, and the second photoresist layer 302 has a second photoresist pattern. After the second photoresist layer 302 is formed, a portion of the anti-reflection layer 82 and a portion of the mask layer 81 are removed by using a photolithography process to form an anti-reflection block 802 and a mask block 801. It should be noted that disposing the anti-reflection layer 82 helps absorb photolithography reflected light in the photolithography process, thereby improving photolithography accuracy of the photolithography process.

Figure 12:
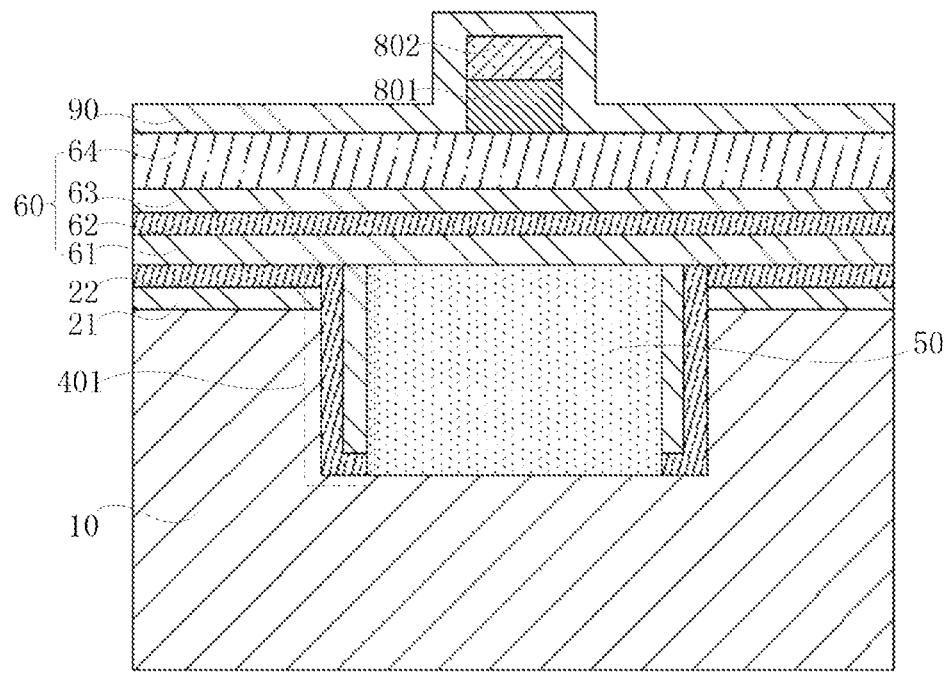
FIG. 12 is a schematic structural diagram illustrating forming a fourth sacrificial layer in a semiconductor structure manufacturing method according to an embodiment of the present disclosure.

Referring to FIG. 12, after the mask block 801 is formed on the third polishing layer, the step of patterning the third sacrificial layer 60 further includes: forming a fourth sacrificial layer 90 on a surface of the third sacrificial layer 60 and a sidewall and a top surface of the mask block 801. In this embodiment, a material of the fourth sacrificial layer can be oxide, and the fourth sacrificial layer 90 further covers a sidewall and a top surface of the anti-reflection block 802.

Figure 13:
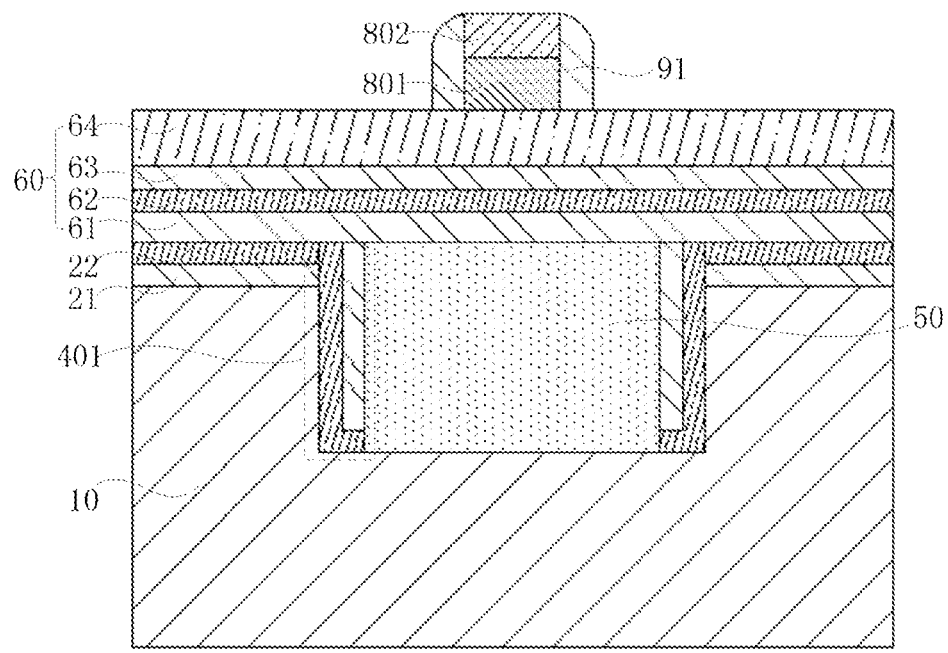
FIG. 13 is a schematic structural diagram illustrating forming a sacrificial sidewall in a semiconductor structure manufacturing method according to an embodiment of the present disclosure.

Referring to FIG. 13, after the fourth sacrificial layer 90 is formed, the step of patterning the third sacrificial layer 60 further includes: removing the fourth sacrificial layer on the third sacrificial layer 60 and the top surface of the mask block 801 to form a sacrificial sidewall 91. For example, while the fourth sacrificial layer 90 on the third sacrificial layer 60 and the top surface of the mask block 801 is removed, the fourth sacrificial layer 90 on the sidewall of the mask block 801 is preserved, and the fourth sacrificial layer 90 on the sidewall of the mask block 801 is the sacrificial sidewall 91. In this embodiment, the sacrificial sidewall 91 further covers the sidewall of the anti-reflection block 802.

It should be noted that an orthographic projection of the formed sacrificial sidewall 91 on the substrate 10 is located in the intermediate structure 50, so a portion of the intermediate structure 50 in the orthographic projection of the sacrificial sidewall 91 is subsequently preserved to form a fin structure.

Figure 14:
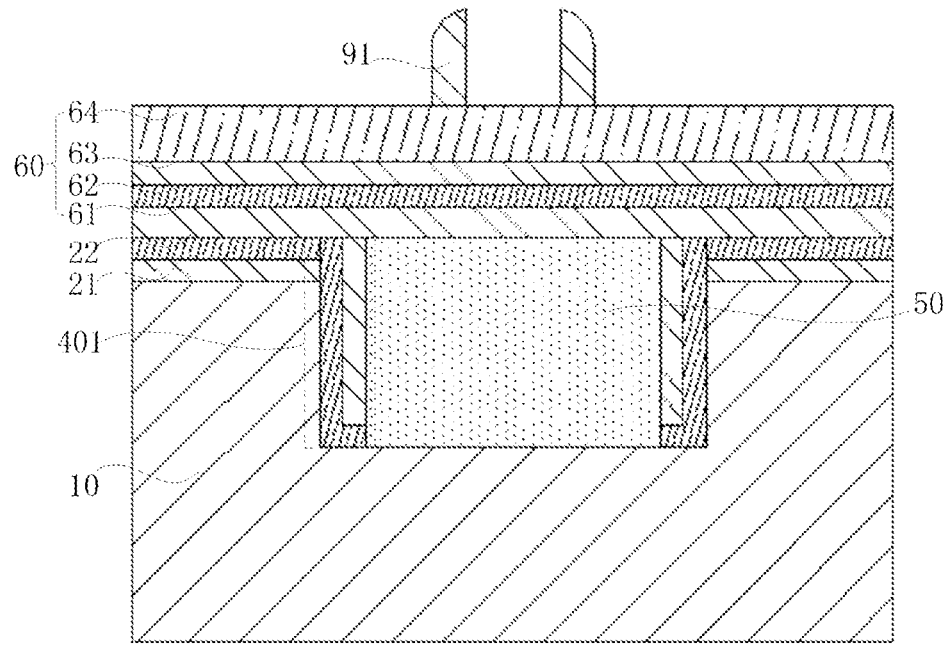
FIG. 14 is a schematic structural diagram illustrating removing a mask block in a semiconductor structure manufacturing method according to an embodiment of the present disclosure.

Referring to FIG. 14, in this embodiment, after the sacrificial sidewall 91 is formed, the step of patterning the third sacrificial layer 60 further includes: removing the anti-reflection block 802 and the mask block 801, to avoid affecting a subsequent process.

Figure 15:
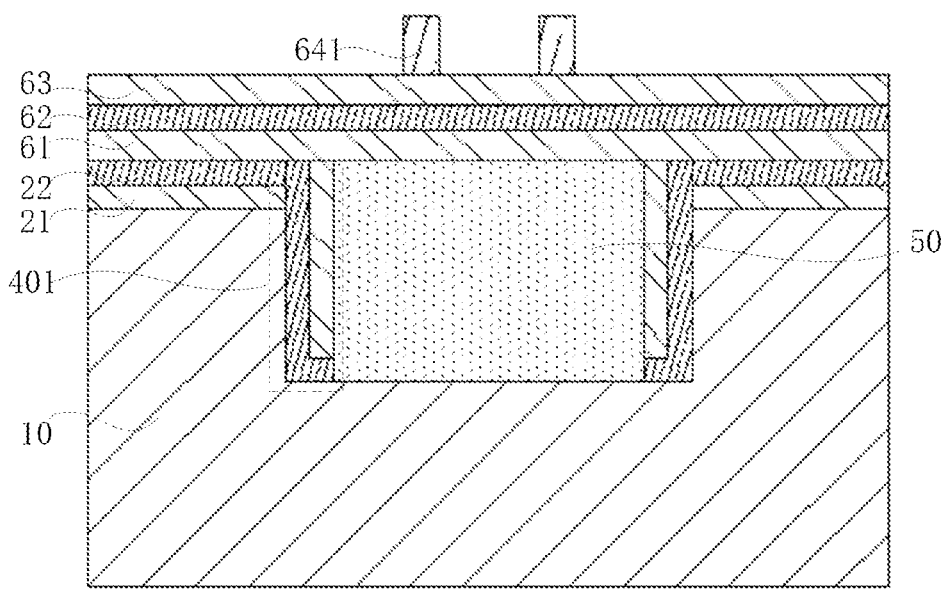
FIG. 15 is a schematic structural diagram illustrating forming a dielectric block in a semiconductor structure manufacturing method according to an embodiment of the present disclosure.
Figure 16:
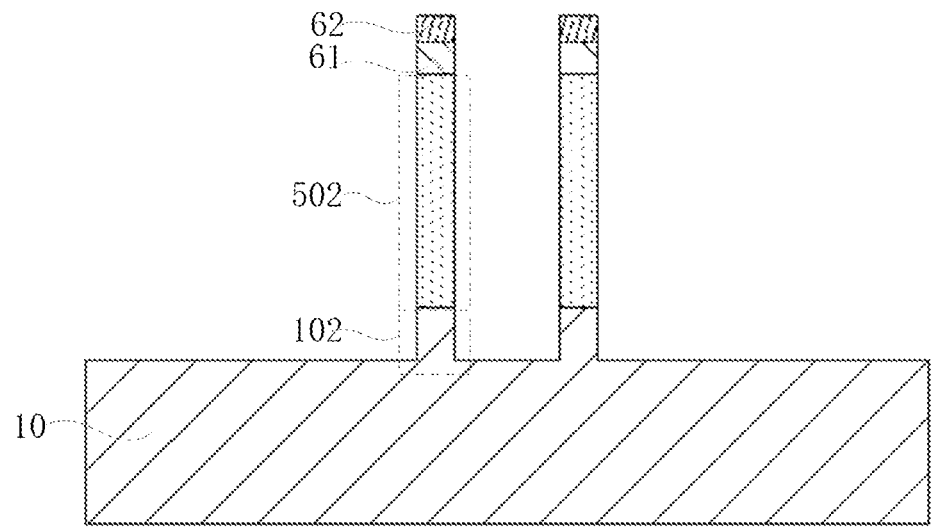
FIG. 16 is a schematic structural diagram illustrating forming a fin structure in a semiconductor structure manufacturing method according to an embodiment of the present disclosure.

Referring to FIG. 15, after the sacrificial sidewall 91 is formed, the step of patterning the third sacrificial layer 60 further includes: etching the third sacrificial layer 60 with the sacrificial sidewall 91 as a mask to form an etch pattern. In this embodiment, the etching the third sacrificial layer 60 with the sacrificial sidewall 91 as a mask includes: etching the hard mask layer 64 with the sacrificial sidewall 91 as a mask, to form a hard mask module 641. Referring to FIG. 16, after the hard mask module 641 is formed, the eighth insulating layer 63, the seventh insulating layer 62, and the sixth insulating layer 61 are sequentially etched with the hard mask module 641 as a mask to form an etch pattern.

In this embodiment, after the third sacrificial layer 60 is patterned, the step of forming the fin structure further includes: etching the intermediate structure 50 and the substrate 10 with the third sacrificial layer 60 as a mask to form the fin structure. For example, after the third sacrificial layer 60 is used as a mask to etch the substrate 10, a lower structure 102 protruding from the substrate 10 is formed, and after the third sacrificial layer 60 is used as a mask to etch the intermediate structure 50, an upper structure 502 covering a top surface of the lower structure 102 is formed, and the lower structure 102 and the upper structure 502 jointly constitute the fin structure.

It should be noted that, by adjusting a size of the formed mask block 801, a spacing between the formed sacrificial sidewalls 91 can be adjusted, to adjust a spacing between the formed fin structures. Herein, "spacing" refers to a distance between adjacent fin structures in a direction parallel to the substrate 10. In this embodiment, by adjusting the size of the formed mask block 801, the spacing between the fin structures can be controlled in a proper range, so as to reduce a spacing between field-effect transistors formed by adjacent fin structures, thereby ensuring integration of a semiconductor device, and reducing interference between formed adjacent transistors.

Further, a thickness of the deposited fourth sacrificial layer 90 can be adjusted to adjust a width of the formed sacrificial sidewall 91 to adjust a width of the formed fin structure. Herein, "width" refers to a distance, in the direction parallel to the substrate 10, of the fin structure in a direction perpendicular to a direction in which the fin structure extends. The upper structure 502 includes a germanium element. Because a surface defect or an impurity can exist on a surface of the semiconductor structure, a germanium element on the surface can also have a defect such as a lattice defect, and electrical performance after powering-on is affected to some extent. When a width of the upper structure 502 is too narrow, most germanium elements can be affected by the surface defect. When the width of the upper structure 502 is relatively wide, germanium elements located in the width direction of the upper structure 502 can be as free as possible from the surface defect. In this embodiment, a thickness of the deposited fourth sacrificial layer 90 can be adjusted to adjust a width of the formed fin structure, thereby improving electrical performance of the formed transistor.

This embodiment of the present disclosure provides a semiconductor structure manufacturing method, including: providing a substrate 10 and forming a groove 101 in the substrate 10; forming a barrier layer 401 on a sidewall of the groove 101; epitaxially growing a channel material 501 from a bottom of the groove 101 to form an intermediate structure 50 in the groove 101; and removing a portion of the intermediate structure 50 and a portion of the substrate 10 to form a fin structure. Compared with the growth of silicon germanium on two sidewalls and a bottom surface of a groove 101 in the prior art, in the embodiments of the present disclosure, a channel material 501 is grown solely on/from the bottom of the groove 101, and internal lattices of a fin structure formed are stably arranged, which helps improve performance of a transistor.

Figure 17:
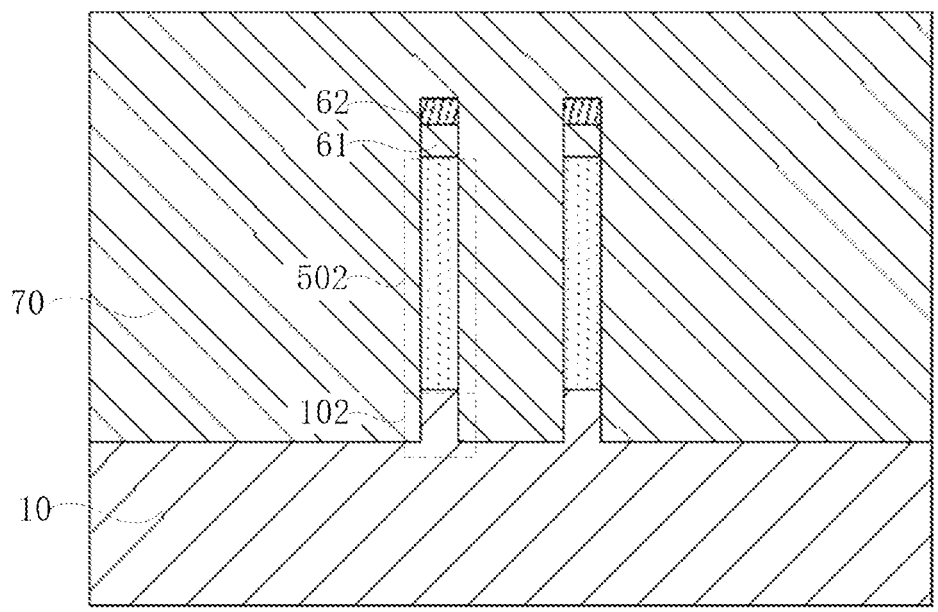
FIG. 17 is a schematic structural diagram illustrating forming an isolating material in a semiconductor structure manufacturing method according to an embodiment of the present disclosure.
Figure 18:
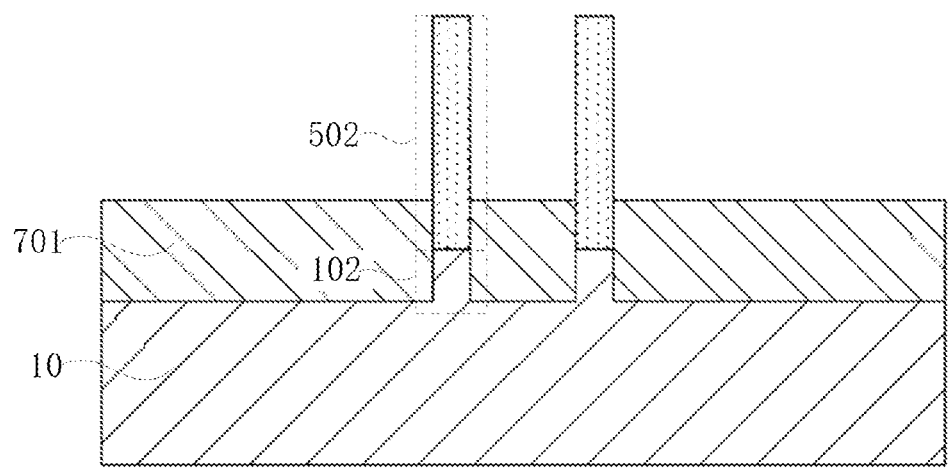
FIG. 18 is a schematic structural diagram illustrating forming an isolating layer in a semiconductor structure manufacturing method according to an embodiment of the present disclosure.

In this embodiment, after the fin structure is formed, the method further includes: forming an isolating layer 701 (FIG. 18) on a bottom sidewall of the fin structure and on the surface of the substrate 10. Referring to FIG. 17, an isolating material 70 can be formed on the surface of the substrate 10, and the sidewall and a top surface of the fin structure. Referring to FIG. 18, after the isolating material 70 is formed, the isolating material 70 covering the top surface and a portion of the sidewall of the fin structure is removed to form the isolating layer 701. In an embodiment, the isolating material 70 can be an insulating material such as oxide or nitride.

For example, a top surface of the isolating layer 701 is higher than a bottom surface of the upper structure 502, so a subsequently formed gate structure is disposed around the upper structure 502, and a formed channel region is located in the upper structure 502, so a parasitic channel is prevented from forming in the lower structure 102, and performance of the formed transistor is improved.

It should be noted that the top surface of the isolating layer 701 being higher than the bottom surface of the upper structure 502 further helps improve mechanical structure stability of the fin structure, ensure a height of the fin structure, and reduce a risk that the fin structure collapses and fails in heat treatment and actual use. "Height" herein refers to a distance from the top surface of the upper structure 502 to the top surface of the isolating layer 701. Further, by adjusting a thickness of the formed isolating layer 701 after etching, the height of the fin structure can be adjusted to prevent the height of the fin structure protruding from the isolating layer 701 from being excessively high, and prevent a lattice defect from being generated in the upper structure 502, thereby avoiding degradation of electrical performance of the formed semiconductor.

An embodiment of the present disclosure further provides a semiconductor structure, and a manufacturing method for the semiconductor structure includes: providing a substrate 10 and forming a groove 101 in the substrate 10; forming a barrier layer 401 on a sidewall of the groove 101; epitaxially growing a channel material 501 from a bottom of the groove 101 to form an intermediate structure 50 in the groove 101; and removing a portion of the intermediate structure 50 and a portion of the substrate 10 to form a fin structure. Compared with the growth of silicon germanium on two sidewalls and a bottom surface of a groove 101 in the prior art, in a manufacturing process of the semiconductor structure in this embodiment of the present disclosure, a channel material 501 is grown on the bottom of the groove 101, and internal lattices of a fin structure formed are stably arranged, which helps improve performance of a transistor.

Referring to FIG. 18, the semiconductor structure includes a substrate 10 and fin structures spaced above the substrate 10. Each fin structure includes an upper structure 502 and a lower structure 102. Materials of the upper structure 502 and the lower structure 102 are different. Because the materials of the upper structure 502 and the lower structure 102 are different, a parasitic channel is prevented from forming in the lower structure 102, and performance of a formed transistor is improved.

Further, the material of the lower structure 102 can include silicon, and the material of the upper structure 502 can include silicon germanium. It should be noted that, because the material of the upper structure 502 includes a germanium element, hole mobility of the fin structure formed can be improved, so as to reduce a resistance of the fin structure, thereby further improving performance of the formed transistor. Further, because lattice constants formed by the germanium element and the silicon element are different, when lattices of the germanium element and the silicon element are grown and formed in the groove 101, internal stress of the formed fin structure is improved, and electrical performance of the intermediate structure 50 is further improved. Further, the material of the upper structure 502 is silicon germanium, which helps improve heat resistance performance of the semiconductor structure.

In this embodiment, the semiconductor structure further includes an isolating layer 701. A top surface of the isolating layer 701 is higher than a bottom surface of the upper structure 502. The isolating layer 701 covers a surface of the substrate 10 and covers a bottom side surface of the fin structure. In an embodiment, a material of the isolating layer 701 can be an insulating material such as oxide or nitride. Therefore, a subsequently formed gate structure is disposed around the upper structure 502, and a formed channel region is located in the upper structure 502, so a parasitic channel is prevented from forming in the lower structure 102, and performance of the formed transistor is further improved.

It should be noted that the top surface of the isolating layer 701 being higher than the bottom surface of the upper structure 502 further helps improve mechanical structure stability of the fin structure, ensure a height of the fin structure, and reduce a risk that the semiconductor structure collapses and fails in heat treatment and actual use. "Height" herein refers to a distance from the top surface of the upper structure 502 to the top surface of the isolating layer 701.

In the above description, it should be understood that, unless otherwise specified and limited, the terms "install", "interconnect", and "connect" should be understood in a broad sense, which, for example, can be a fixed connection, or an indirect connection via an intermediate medium, or can be communication inside two elements or an interaction relationship between two elements. For persons of ordinary skill in the art, specific meanings of the above terms in the present disclosure can be understood based on a specific situation. The terms "upper", "lower", "front", "back", "vertical", "horizontal", "top", "bottom", "inside", "outside", etc. are based on the directions or position relationships shown in the accompanying drawings, and are merely intended to describe the present disclosure and simplify the descriptions, but are not intended to indicate or imply that an apparatus or an element shall have a specific direction or be formed and operated in a specific direction, and therefore shall not be understood as a limitation on the present disclosure. In the description of the present disclosure, "a plurality of" means two or more, unless specifically specified otherwise.

In the present specification, claims, and accompanying drawings of the present disclosure, the terms "first", "second", "third", "fourth", and so on (if existing) are intended to distinguish between similar objects rather than describe a specific order or sequence. It should be understood that the terms used in such a way are interchangeable in a proper circumstance, so the embodiments of the present disclosure described herein can be implemented in orders except the order illustrated or described herein. Moreover, the terms "include", "contain" and any other variants mean to cover the non-exclusive inclusion. For example, a process, method, system, product, or device that includes a list of steps or units is not necessarily limited to those steps or units, but can include other steps or units not expressly listed or inherent to such a process, method, product, or device.

Finally, it should be noted that the above embodiments are merely intended for describing the technical solutions of the present disclosure other than limiting the present disclosure. Although the present disclosure is described in detail with reference to the above embodiments, persons of ordinary skill in the art should understand that they can still make modifications to the technical solutions described in the above embodiments or make equivalent replacements to some or all technical features thereof, without departing from the scope of the technical solutions of the embodiments of the present disclosure.

What is claimed is:

1. A semiconductor structure manufacturing method, comprising:
   providing a substrate and forming a groove in the substrate;
   forming a barrier layer on a sidewall of the groove;
   epitaxially growing a channel material from a bottom of the groove to form an intermediate structure in the groove; and
   removing a portion of the intermediate structure and a portion of the substrate to form a fin structure;
   wherein the forming the groove in the substrate includes:
      forming a first sacrificial layer on the substrate, and etching the first sacrificial layer to form a first opening; and
      etching a portion of the substrate along the first opening to form the groove;
   and wherein the first sacrificial layer includes a third insulating layer, a fourth insulating layer, and a fifth insulating layer, the third insulating layer covers a surface of the substrate, the fourth insulating layer is located between the third insulating layer and the fifth insulating layer, and the fifth insulating layer covers a side of the fourth insulating layer that is away from the substrate.

2. The semiconductor structure manufacturing method according to claim 1, wherein the forming the barrier layer on the sidewall of the groove includes:
   forming a second sacrificial layer on the sidewall and at the bottom of the groove; and
   removing the second sacrificial layer at the bottom of the groove, the second sacrificial layer on the sidewall of the groove constituting the barrier layer.

3. The semiconductor structure manufacturing method according to claim 2, wherein the forming the second sacrificial layer on the sidewall and at the bottom of the groove includes:
   forming a first insulating layer on the sidewall and at the bottom of the groove; and
   forming a second insulating layer on the first insulating layer, the first insulating layer and the second insulating layer constituting the second sacrificial layer.

4. The semiconductor structure manufacturing method according to claim 3, wherein the removing the second sacrificial layer at the bottom of the groove includes:
   removing the second insulating layer at the bottom of the groove by using anisotropic dry etching; and
   cleaning the substrate by using a cleaning solution after the second insulating layer is removed, so as to remove the first insulating layer at the bottom of the groove.

5. The semiconductor structure manufacturing method according to claim 2, wherein
   the first sacrificial layer and the second sacrificial layer further cover the substrate; and
   the second sacrificial layer on the substrate is removed while the second sacrificial layer at the bottom of the groove is removed.

6. The semiconductor structure manufacturing method according to claim 1, wherein the epitaxially growing the channel material from the bottom of the groove to form the intermediate structure in the groove further includes:
   growing the channel material to protrude from the groove; and
   removing a portion of the channel material and the fifth insulating layer on the substrate by using a chemical mechanical polishing process, to form the intermediate structure, a top surface of the intermediate structure being flush with a surface of the fourth insulating layer.

7. The semiconductor structure manufacturing method according to claim 1, wherein the removing the portion of the intermediate structure and the portion of the substrate includes:
   forming a third sacrificial layer on the intermediate structure, and patterning the third sacrificial layer; and
   etching the intermediate structure and the substrate with the third sacrificial layer as a mask to form the fin structure.

8. The semiconductor structure manufacturing method according to claim 7, wherein the forming the third sacrificial layer on the intermediate structure, and patterning the third sacrificial layer includes:
   forming a mask block on the third sacrificial layer, an orthographic projection of the mask block on the substrate being located in the intermediate structure;
   forming a fourth sacrificial layer on a surface of the third sacrificial layer and a sidewall and a top surface of the mask block;
   removing the fourth sacrificial layer on the third sacrificial layer and the top surface of the mask block to form a sacrificial sidewall; and
   etching the third sacrificial layer with the sacrificial sidewall as a mask to form an etch pattern.

9. The semiconductor structure manufacturing method according to claim 1, after the removing the portion of the intermediate structure and the portion of the substrate, further comprising:
   forming an isolating layer on a bottom sidewall of the fin structure and on the surface of the substrate.

10. A semiconductor structure formed by the semiconductor structure manufacturing method according to claim 1, comprising a substrate and fin structures spaced apart from each other above the substrate.

11. The semiconductor structure according to claim 10, wherein each of the fin structures includes an upper structure and a lower structure, and a material of the upper structure is different from a material of the lower structure.

12. The semiconductor structure according to claim 11, wherein the material of the lower structure includes silicon, and the material of the upper structure includes silicon germanium.

13. The semiconductor structure according to claim 11, wherein the semiconductor structure further comprises an isolating layer, a top surface of the isolating layer is higher than a bottom surface of the upper structure, and the isolating layer covers a surface of the substrate and covers a bottom side surface of the fin structure.

14. The semiconductor structure according to claim 13, wherein the top surface of the isolating layer is lower than an upper surface of the upper structure.

15. The semiconductor structure according to claim 13, wherein an interface between the upper structure and the lower structure is buried in the isolating layer.

16. A method for forming a metal-oxide-semiconductor field-effect transistor comprising the semiconductor structure manufacturing method according to claim 1.

17. A method for forming a dynamic random access memory comprising the semiconductor structure manufacturing method according to claim 1.

* * * * *